United States Patent
Roy

(10) Patent No.: US 10,475,848 B2
(45) Date of Patent: Nov. 12, 2019

(54) INTEGRATED CIRCUIT IMAGE SENSOR CELL WITH SKIMMING GATE IMPLEMENTED USING A VERTICAL GATE TRANSISTOR STRUCTURE

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 37 days.

(21) Appl. No.: 15/839,011

(22) Filed: Dec. 12, 2017

(65) Prior Publication Data

US 2019/0181180 A1    Jun. 13, 2019

(51) Int. Cl.
*H01L 27/148* (2006.01)
*H01L 27/146* (2006.01)
*H04N 9/00* (2006.01)

(52) U.S. Cl.
CPC .... *H01L 27/14812* (2013.01); *H01L 27/1463* (2013.01); *H01L 27/14603* (2013.01); *H01L 27/14614* (2013.01); *H04N 9/00* (2013.01); *H01L 27/14643* (2013.01)

(58) Field of Classification Search
CPC ............. H01L 27/146; H01L 27/14603; H01L 27/14609; H01L 27/14612; H01L 27/14614; H01L 27/14616; H01L 27/1463; H01L 27/14638; H01L 27/14641; H01L 27/14643; H01L 27/148; H01L 27/14806; H01L 27/14812
See application file for complete search history.

(56) References Cited

U.S. PATENT DOCUMENTS

| | | | |
|---|---|---|---|
| 5,146,302 | A | 9/1992 | Kumada |
| 8,531,567 | B2 | 9/2013 | Roy et al. |
| 2013/0015910 | A1 | 1/2013 | Tubert et al. |
| 2018/0294305 | A1* | 10/2018 | Janssens ........... H01L 27/14643 |

OTHER PUBLICATIONS

"Resistive Gate Type CCD Linear Image Sensor with Electronic Shutter Function", Hamamatsu Technical Information, Mar. 2016 (37 pages).

* cited by examiner

*Primary Examiner* — David C Spalla
(74) *Attorney, Agent, or Firm* — Crowe & Dunlevy

(57) ABSTRACT

An imaging cell includes a skimming gate transistor coupled between a photosensitive charge node and an intermediate node and a transfer gate transistor coupled between the intermediate node and a sense node. The skimming gate transistor includes a vertical gate electrode structure formed by a first capacitive deep trench isolation extending into a substrate and a second capacitive deep trench isolation extending into the substrate. A channel of the skimming gate transistor is positioned between the first and second capacitive deep trench isolations. Each capacitive deep trench isolation is formed by a trench that is lined with an insulating liner and filled with a conductive or semiconductive material.

19 Claims, 3 Drawing Sheets

US 10,475,848 B2

INTEGRATED CIRCUIT IMAGE SENSOR CELL WITH SKIMMING GATE IMPLEMENTED USING A VERTICAL GATE TRANSISTOR STRUCTURE

TECHNICAL FIELD

The present disclosure relates to an image sensor and, in particular, to an image sensor cell including a skimming gate.

BACKGROUND

Reference is made to FIG. 1 showing a circuit schematic for a prior art photosensitive cell 10 for an image sensor which includes an array of such cells 10 arranged in a matrix of rows and columns. The cell 10 includes a photodiode 12 having an anode that is connected to ground and a cathode connected to node 14. A transfer gate transistor 16 has a source terminal connected to node 14 and a drain terminal connected to node 18 which comprises a sense node. The gate of transfer gate transistor 16 is driven by a transfer gate control signal TG. The cell 10 further includes a reset transistor 20 having a drain terminal connected to a supply voltage node Vdd and a source terminal connected to the node 18. The gate of reset transistor 20 is driven by a reset signal RST. The node 18 is connected to the gate of a source follower transistor 22 having a drain terminal connected to the supply voltage node Vdd and a source terminal connected to node 24. A read transistor 28 has a drain terminal connected to node 24 and a source terminal connected to a column line 30 of the array of cells 10. The gate of read transistor 28 is driven by a read signal RD.

The cell 10 operates in a manner well known to those skilled in the art. Transistor 16 is turned off by signal TG and the photodiode 12 responds to illumination by generating charges at node 14. The transistor 28 is turned on to transfer voltage at node 18 to the column line 30. The reset transistor 20 is turned on by signal RST to precharge the voltage at node 18 to Vdd. The reset transistor 20 is then turned off and the transistor 16 is turned on. Stored charges are transferred from node 14 to node 18 and the voltage at node 18 falls to a level dependent on the strength of the illumination and the corresponding stored charges. The transistor 16 and the transistor 28 are then turned off.

SUMMARY

In an embodiment, an imaging cell comprises: a skimming gate transistor coupled between a photosensitive charge node and an intermediate node; and a transfer gate transistor coupled between the intermediate node and a sense node. The skimming gate transistor includes a vertical gate electrode structure comprising: a first capacitive deep trench isolation extending into a substrate; and a second capacitive deep trench isolation extending into the substrate. A channel of the skimming gate transistor is positioned between the first and second capacitive deep trench isolations, and each capacitive deep trench isolation of the first and second capacitive deep trench isolations comprises a trench lined with an insulating liner and filled with a conductive or semiconductive material.

The trenches for the first and second capacitive deep trench isolations may extend parallel to each other and to the length of the channel.

The trenches for the first and second capacitive deep trench isolations may extend non-parallel to each other and to the length of the channel.

BRIEF DESCRIPTION OF THE DRAWINGS

The foregoing and other features and advantages will be discussed in detail in the following non-limiting description of specific embodiments in connection with the accompanying drawings, wherein.

DETAILED DESCRIPTION

Figure 1:
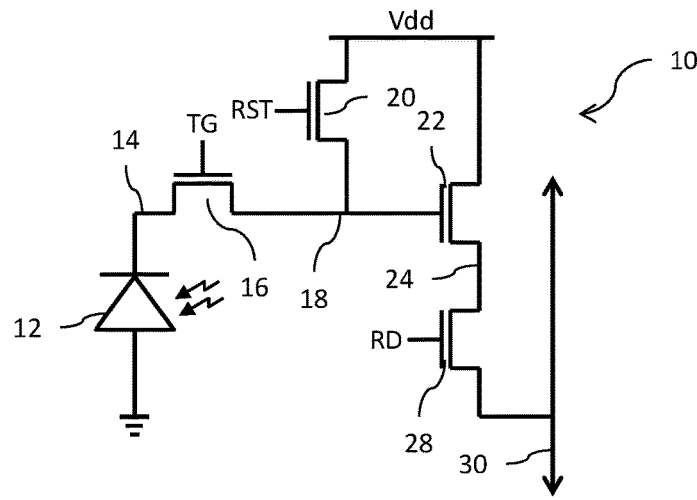
FIG. 1 is a circuit schematic for a prior art photosensitive cell.
Figure 2:
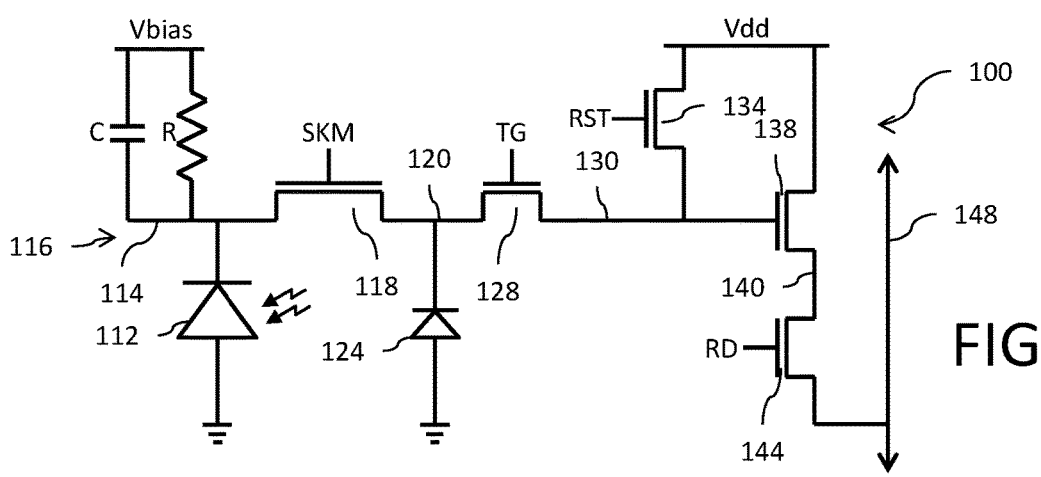
FIG. 2 is a circuit schematic for a photosensitive cell which includes a skimming gate.

Reference is made to FIG. 2 showing a circuit schematic for a photosensitive cell 100 for an image sensor which includes an array of such cells 100 arranged in a matrix of rows and columns. The cell 100 comprises a photocell 116 which includes a photosensitive device 112 such as a diode having an anode that is connected to ground and a cathode connected to a photosensitive charge node 114. A basic electrical modeling of the photosensitive material of the photocell 116 is represented by the resistor R and capacitor C connected in parallel with each other between a bias supply voltage node Vbias and the photosensitive charge node 114. This modeling concerns, for example, a reverse biased semiconductor junction, quantum dot material, amorphous silicon material, etc. The cell 100 further comprises a skimming gate transistor 118 having a source terminal connected to photosensitive charge node 114 and a drain terminal connected to node 120 which comprises a pinned charge collector (represented by pinned diode 124). The gate of skimming gate transistor 118 is driven by a skim control signal SKM. A transfer gate transistor 128 has a source terminal connected to node 120 and a drain terminal connected to node 130. The gate of transfer gate transistor 128 is driven by a transfer gate control signal TG. A reset transistor 134 having a drain terminal connected to a supply voltage node Vdd and a source terminal connected to the node 130. The gate of reset transistor 134 is driven by a reset signal RST. The node 130 is connected to the gate of a source follower transistor 138 having a drain terminal connected to the supply voltage node Vdd and a source terminal connected to node 140. A read transistor 144 has a drain terminal connected to node 140 and a source terminal connected to a column line 148 of the array of cells 100. The gate of read transistor 144 is driven by a read signal RD.

Figure 3A:
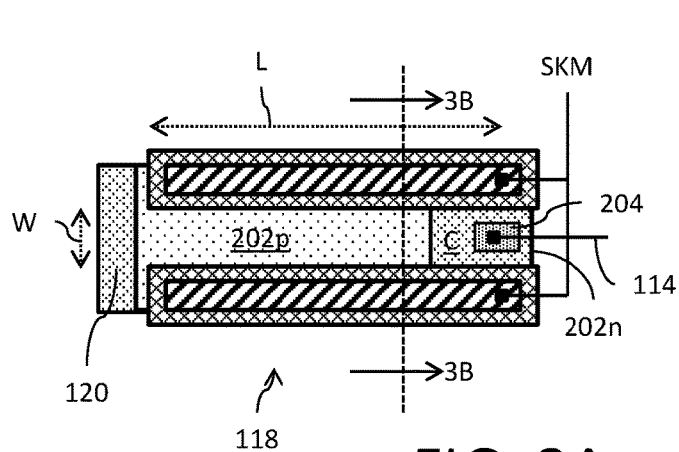
FIGS. 3A-3B show, respectively, a plan view and a cross sectional view of an embodiment for the skimming gate transistor.
Figure 3B:
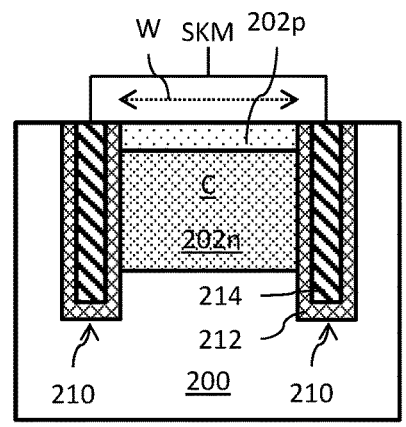

Reference is now made to FIGS. 3A-3B which illustrate, respectively, a plan view and a cross sectional view of an embodiment for the skimming gate transistor 118. A semiconductor substrate 200 that is doped with a p-type conductivity dopant includes a region 202p at the top surface of the substrate 200 that is doped with a p-type conductivity dopant and a region 202n, buried in part below the region 202p, that is doped with an n-type conductivity dopant. The region 202n forms the channel (C) of the skimming gate transistor 118 and extends to further form node 120 of the pinned charge collector. An n-type overdoped region 204 in contact with the n-type region 202n is provided to assist with making the electrical connection to photosensitive charge node 114 of the photocell 116.

A vertical gate (VEGA) electrode type structure is formed in the substrate 200 by a pair of trenches 210 that define there between the channel C of the skimming gate transistor 118. Each trench 210 includes an insulating liner 212 (such as formed by a thermal oxide) and a filler made of a conductive or semiconductive material 214 (such as a metal or a polysilicon material). Such a structure is also known to the art as a capacitive deep trench isolation (CDTI). A width of each trench 210 may, for example, be 0.2-0.4 µm. Each trench 210 extends to a depth that equals or exceeds the depth of the region 202n (but does not necessarily extend completely through the substrate 200). The conductive or semiconductive material 214 filling each trench 210 is electrically connected to be biased with the skim control signal SKM. In this embodiment, the pair of trenches 210 extend parallel to each other in a direction of the length (L) of the transistor 118. Here, the length L of the transistor corresponds to a length of the conductor filled trenches 210 of the VEGA electrode type structure. Although only generally shown in FIG. 3A, it will be understood that the region 202p preferably extends in the length direction past the CDTI structures to at least partly, if not fully, cover node 120 of the pinned charge collector associated with pinned diode 124.

The voltage level of the applied skim control signal SKM, along with the dopant level in region 202n and the width (W) of the channel C between the trenches 210, controls conductivity of the portion of the region 202n forming the transistor channel. Photocurrent is received by the source terminal of the skimming gate transistor 118 from the photosensitive charge node 114. Electron conduction is in the silicon volume of the region 202n with hole accumulation at the interface of the region 202n with the thermal oxide liner 212 at the trench 210 sidewall. The hole accumulation is ensured by the control voltage for the SKM signal applied to the skimming gate. In the absence of the photocurrent, the channel C is fully depleted with an electrostatic potential fixed by the dimensions of the transistor (in particular, the width W) and the channel net doping.

In an embodiment, the width W may about 200 nm (±5%), the length L may be about 400 nm (±5%) and the dopant concentration level of the region 202n may be about $6 \times 10^{16}$ at/cm$^3$ (±5%).

The skimming gate transistor 118 operates to maintain a constant voltage through the photosensitive material. This is important because the sensitivity of the photosensitive material may be bias dependent, so the voltage between Vbias and node 114 should remain nearly constant with or without photocurrent. The photosensitive material is connected to the cathode terminal of the diode at the source of transistor 118. Photocurrent collected by the diode is drained (i.e., skimmed) off the node 114 through the channel of the transistor 118 and collected in the collector region at node 120. The skim level at which diode generated charges are permitted to drain from source node 114 is set by the electrostatic voltage of the VEGA electrode type structure and is controlled by the voltage level of the skim control signal SKM.

Figure 4A:
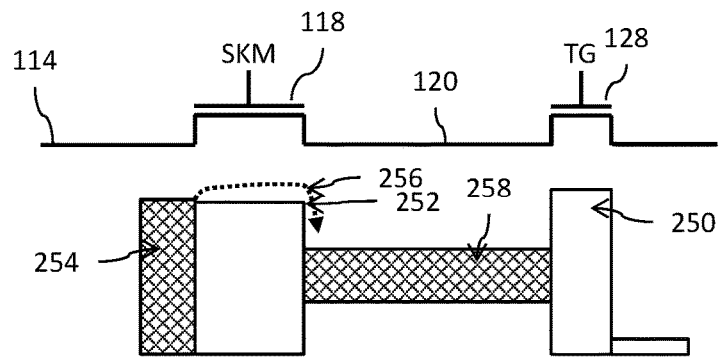
FIGS. 4A-4B are charge flow diagrams illustrating operation of the photosensitive cell of FIG. 2 with skimming gate transistor as shown in FIGS. 3A-3B.
Figure 4B:
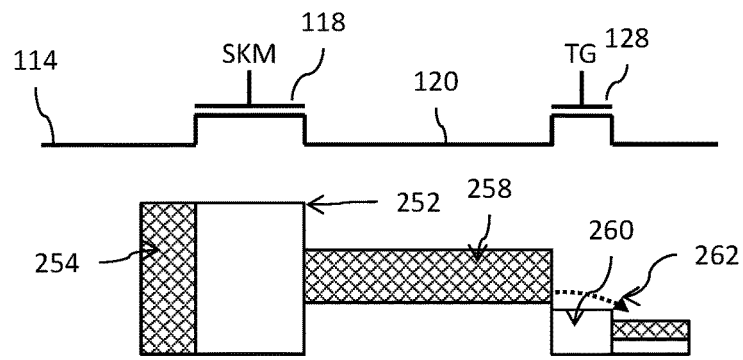

The cell 100 with skimming gate transistor 118 operates in the following manner. Transistor 144 is turned on to transfer the voltage at node 130 to the column line 148. Transistor 128 is turned off by signal TG (reference 250, FIG. 4A) and the voltage of the applied skim control signal SKM sets a skim level (reference 252, FIG. 4A) above which charges at photosensitive charge node 114 are permitted to drain through transistor 118 to charge collection node 120. The photocell 116 responds to illumination by generating charges 254 at photosensitive charge node 114. The reset transistor 134 is turned on by signal RST to precharge the voltage at node 130 to Vdd. As charges continue to be generated by the photocell 116, eventually a sufficient amount of charge is generated so as to exceed the skim level 252. Further generated charges then drain (reference 256, FIG. 4A) from photosensitive charge node 114 to node 120 for collection (reference 258, FIG. 4A). The reset transistor 134 is then turned off and the transistor 128 is turned on (reference 260, FIG. 4B). Stored charges are transferred from node 120 to node 130 (reference 262, FIG. 4B) and the voltage at node 130 falls to a level dependent on the strength of the illumination and the corresponding stored charges. The transistor 128 and the transistor 144 are then turned on off.

Figure 5A:
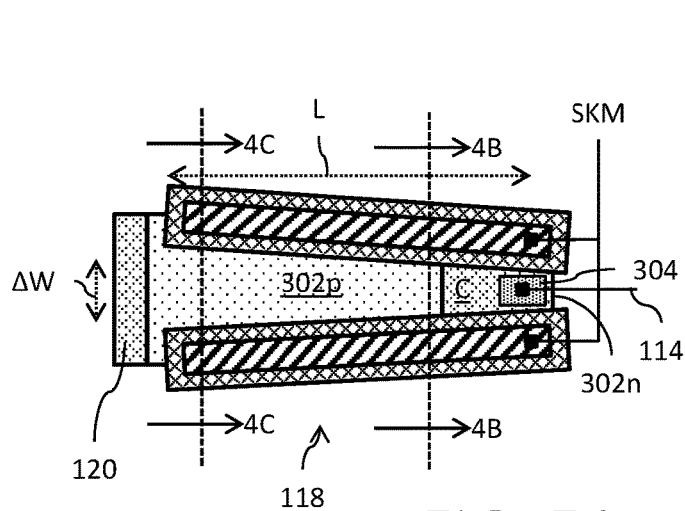
FIGS. 5A-5C show, respectively, a plan view and two cross sectional views of an embodiment for the skimming gate transistor.
Figure 5B:
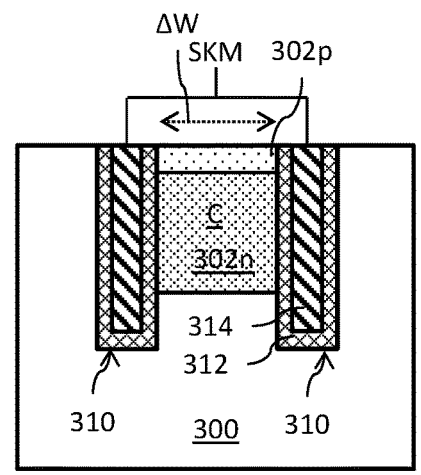
Figure 5C:
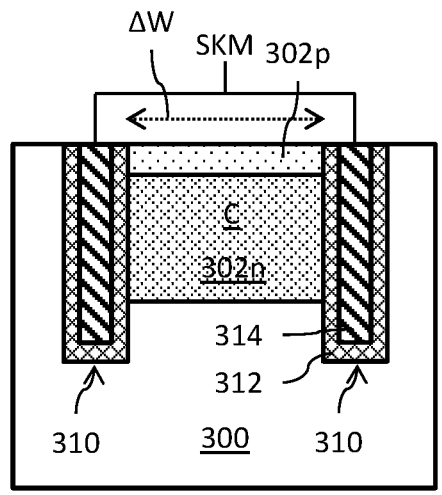
Figure 6A:
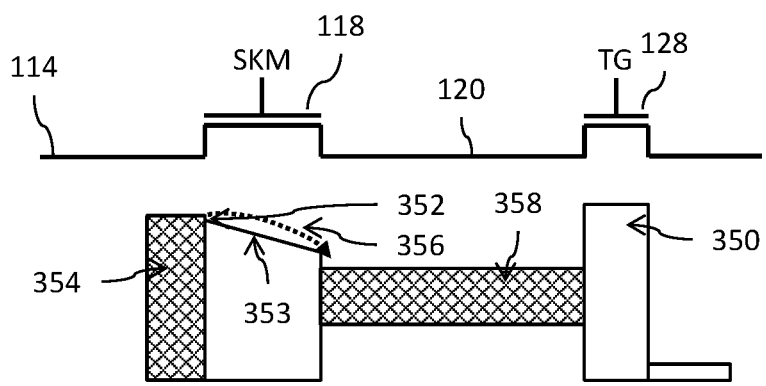
FIGS. 6A-6B are charge flow diagrams illustrating operation of the photosensitive cell of FIG. 2 with skimming gate transistor as shown in FIGS. 5A-5C.
Figure 6B:
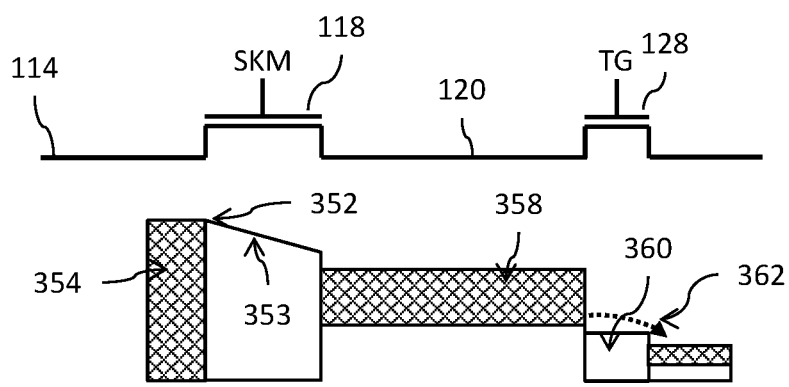

Reference is now made to FIGS. 5A-5C which illustrate, respectively, a plan view and two cross sectional views of an embodiment for the skimming gate transistor 118. A semiconductor substrate 300 that is doped with a p-type conductivity dopant includes a region 302p at the top surface of the substrate 300 that is doped with a p-type conductivity dopant and a region 302n, buried in part below the region 302p, that is doped with an n-type conductivity dopant. The region 302n forms the channel (C) of the skimming gate transistor 118 and extends to further form node 120 of the pinned charge collector. An n-type overdoped region 304 in contact with the n-type region 302n is provided to assist with making the electrical connection to photosensitive charge node 114 of the photocell 116.

A vertical gate (VEGA) electrode type structure is formed in the substrate 300 by a pair of trenches 310 that define there between the channel C of the skimming gate transistor 118. Each trench 310 includes an insulating liner 312 (such as formed by a thermal oxide) and a filler made of a conductive or semiconductive material 314 (such as a metal or a polysilicon material). Such a structure is also known to the art as a capacitive deep trench isolation (CDTI). A width of each trench 310 may, for example, be 0.2-0.4 µm. Each trench 310 extends to a depth that equals or exceeds the depth of the region 302n (but does not necessarily extend completely through the substrate 200). The conductive or semiconductive material 314 filling each trench 310 is electrically connected to be biased with the skim control signal SKM. Although only generally shown in FIG. 5A, it will be understood that the region 302p preferably extends in the length direction past the CDTI structures to at least partly, if not fully, cover node 120 of the pinned charge collector associated with pinned diode 124.

The voltage level of the applied skim control signal SKM, along with the dopant level in region 302n and the width (ΔW) of the channel C between the trenches 310, controls conductivity of the portion of the region 302n forming the transistor channel. Here, the width ΔW increases along a length (L) of the transistor channel C from the photosensitive charge node 114 to the node 120 because the trenches 310 extend non-parallel to each other and non-parallel to the length L of the channel. The length L corresponds in this configuration to a base length of a right triangle having a hypotenuse equal to the length of the conductor filled trenches 310 of the VEGA electrode type structure. The acute angle formed by the base and hypotenuse may, for example, be between 5 and 20 degrees. Photocurrent is received by the source terminal of the skimming gate transistor 118 from the photocell 116 at photosensitive charge node 114. Electron conduction is in the silicon volume of the region 302n with hole accumulation at the interface of the region 302n with the thermal oxide liner 312 at the trench 310 sidewall. In the absence of photocurrent, the channel C is fully depleted with an electrostatic potential fixed by the dimensions of the transistor (in particular, the width W) and the channel net doping.

In an embodiment, the width W may linearly increase along the length L from a narrowest width of about 120 nm (±5%) to a widest width of about 400 nm (±5%), the length L may be about 500 nm (±5%) and the dopant concentration level of the region 202 may be about $5 \times 10^{16}$ at/cm$^3$ (±5%).

The skimming gate transistor 118 operates to provide a graded electrostatic potential (potential slope) thanks to the ΔW increase along the length L as understood by those skilled in the art with respect to a fully depleted MOS buried channel. This is advantageous because it supports reduced charge transit time while maintaining as far as possible a steady voltage at node 114. Photocurrent generated by the photocell 116 is drained (i.e., skimmed) off the node 114 through the channel of the transistor 118 and collected in the collector region at node 120. The skim level at which diode collected charges are permitted to drain from source node 114 is set by the electrostatic voltage of the VEGA electrode type structure and is controlled by the voltage level of the skim control signal SKM.

The cell 100 with skimming gate transistor 118 operates in the following manner. Transistor 144 is turned on to transfer the voltage at node 130 to the column line 148. Transistor 128 is turned off by signal TG (reference 350, FIG. 5A) and the voltage of the applied skim control signal SKM sets a skim level (reference 352, FIG. 5A) above which charges at photosensitive charge node 114 are permitted to drain through transistor 118 to charge collection node 120. The structural characteristics influenced by the ΔW increase set the negative potential slope (reference 353, FIG. 5A). The photocell 116 responds to illumination by generating charges 354 at photosensitive charge node 114. The reset transistor 134 is turned on by signal RST to precharge the voltage at node 130 to Vdd. As charges continue to be generated by the photocell 116, eventually a sufficient amount of charge is generated so as to exceed the skim level 352. Further generated charges then drain (reference 356, FIG. 5A) from photosensitive charge node 114 to node 120 for collection (reference 358, FIG. 5A). The reset transistor 134 is then turned off and the transistor 128 is turned on (reference 360, FIG. 5B). Stored charges are transferred from node 120 to node 130 (reference 362, FIG. 5B) and the voltage at node 130 falls to a level dependent on the strength of the illumination and the corresponding stored charges. The transistor 128 and the transistor 144 are then turned off.

The same elements have been designated with the same reference numerals in the various drawings and, further, the various drawings are not to scale. For clarity, only those elements which are useful to the understanding of the described embodiments have been shown and are detailed.

In this description, terms "high", "side", "lateral", "top", "above", "under", "on", "upper", and "lower" refer to the orientation of the concerned elements in the corresponding drawings.

Alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An imaging cell, comprising:
   a substrate doped with a first conductivity type;
   a skimming gate transistor coupled between a photosensitive charge node and an intermediate node, wherein the photosensitive charge node and intermediate node are regions within the substrate that are doped with a second conductivity type opposite the first conductivity type; and
   a transfer gate transistor coupled between the intermediate node and a sense node, wherein the sense node is a region within the substrate that is doped with the second conductivity type;
   wherein the skimming gate transistor includes a vertical gate electrode structure comprising:
      a first capacitive deep trench isolation extending into the substrate; and
      a second capacitive deep trench isolation extending into the substrate;
      wherein a channel of the skimming gate transistor is positioned between the first and second capacitive deep trench isolations, wherein said channel is a region within the substrate that is doped with the second conductivity type; and
      wherein each capacitive deep trench isolation comprises a trench lined with an insulating liner and filled with a conductive or semiconductive material.

2. The imaging cell of claim 1, wherein the trenches of the first and second capacitive deep trench isolations extend parallel to each other and parallel to a length of the channel of the skimming gate transistor.

3. The imaging cell of claim 2, wherein a width of the channel of the skimming gate transistor is constant along the length of the channel from a connection to the photosensitive charge node to the intermediate node.

4. The imaging cell of claim 1, wherein the trenches of the first and second capacitive deep trench isolations extend non-parallel to each other and non-parallel to a length of the channel of the skimming gate transistor.

5. The imaging cell of claim 4, wherein a width of the channel of the skimming gate transistor increases along the length of the channel from a connection to the photosensitive charge node to the intermediate node.

6. The imaging cell of claim 5, wherein the increase in width of the channel is a linear increase.

7. The imaging cell of claim 1, wherein the conductive or semiconductive material filling each trench is configured to receive a skimming control signal that sets a skim level of the skimming gate transistor for transfer of charges from the photosensitive charge node to the intermediate node.

8. An integrated circuit, comprising:
   a semiconductor substrate doped with a first conductivity type;
   a photodiode having a doped charge generating region within the semiconductor substrate, wherein the doped charge generating region is doped with a second conductivity type opposite the first conductivity type;
   a skimming gate transistor including a doped channel region within the semiconductor substrate coupled between the doped charge generating region and a doped intermediate region, wherein the doped intermediate region and the doped channel region are both doped with the second conductivity type; and a transfer gate transistor coupled between the doped intermediate region and a doped sense region;

wherein the skimming gate transistor includes a vertical gate electrode structure comprising:

a first capacitive deep trench isolation extending into the semiconductor substrate; and a second capacitive deep trench isolation extending into the semiconductor substrate;

wherein the doped channel region is positioned between the first and second capacitive deep trench isolations; and wherein each capacitive deep trench isolation comprises a trench lined with an insulating liner and filled with a conductive or semiconductive material.

9. The integrated circuit of claim 8, wherein the first and second trenches extend parallel to each other and parallel to a length of the doped channel region of the skimming gate transistor.

10. The integrated circuit of claim 9, wherein a width of the doped channel region of the skimming gate transistor is constant along the length of the doped channel region.

11. The integrated circuit of claim 1, wherein the first and second trenches extend non-parallel to each other and non-parallel to a length of the doped channel region of the skimming gate transistor.

12. The integrated circuit of claim 11, wherein a width of the doped channel region of the skimming gate transistor increases along the length of the doped channel region.

13. The integrated circuit of claim 12, wherein the increase in width of the doped channel region is a linear increase.

14. The integrated circuit of claim 8, wherein the conductive or semiconductive material filling each trench is configured to receive a skimming control signal that sets a skim level of the skimming gate transistor for transfer of charges from the doped charge generating region to the doped intermediate region.

15. The integrated circuit of claim 8, further comprises doped surface region that at least partly covers the doped channel region and extends between the first and second capacitive deep trench isolations, wherein said doped surface region is doped with the first conductivity type.

16. An imaging cell, comprising:

a skimming gate transistor coupled between a photosensitive charge node and an intermediate node; and a transfer gate transistor coupled between the intermediate node and a sense node;

wherein the skimming gate transistor includes a vertical gate electrode structure comprising:

a first capacitive deep trench isolation extending into a substrate; and a second capacitive deep trench isolation extending into the substrate;

wherein a channel of the skimming gate transistor is positioned between the first and second capacitive deep trench isolations;

wherein each capacitive deep trench isolation comprises a trench lined with an insulating liner and filled with a conductive or semiconductive material; and wherein the trenches of the first and second capacitive deep trench isolations extend non-parallel to each other and non-parallel to a length of the channel of the skimming gate transistor.

17. The imaging cell of claim 16, wherein a width of the channel of the skimming gate transistor increases along the length of the channel from the photosensitive charge node to the intermediate node.

18. The imaging cell of claim 17, wherein the increase in width of the channel is a linear increase.

19. The imaging cell of claim 16, wherein the conductive or semiconductive material filling each trench is configured to receive a skimming control signal that sets a skim level of the skimming gate transistor for transfer of charges from the photosensitive charge node to the intermediate node.

* * * * *